United States Patent
Aono et al.

(10) Patent No.: US 6,906,410 B2
(45) Date of Patent: Jun. 14, 2005

(54) SEMICONDUCTOR DEVICE AND METHOD FOR MANUFACTURING SAME

(75) Inventors: Tsutomu Aono, Tatebayashi (JP); Kikuo Okada, Kamisato-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 199 days.

(21) Appl. No.: 10/374,521

(22) Filed: Feb. 27, 2003

(65) Prior Publication Data

US 2004/0214419 A1 Oct. 28, 2004

(30) Foreign Application Priority Data

Feb. 28, 2002 (JP) ........................................ 2002-053784

(51) Int. Cl.$^7$ ............................................... H01L 23/52
(52) U.S. Cl. .................... 257/691; 257/762; 257/560; 257/561; 257/562; 257/563; 257/564
(58) Field of Search .................... 257/691, 762, 257/560, 561, 562, 563, 564, 578, 579, 580, 584, E21.382, E21.507

(56) References Cited

U.S. PATENT DOCUMENTS

| | | | | |
|---|---|---|---|---|
| 4,751,482 A | * | 6/1988 | Fukuta et al. ............... | 333/247 |
| 5,309,014 A | * | 5/1994 | Wilson ........................ | 257/584 |
| 5,311,057 A | * | 5/1994 | McShane ..................... | 257/676 |
| 5,311,058 A | * | 5/1994 | Smolley ...................... | 257/691 |
| 5,347,160 A | * | 9/1994 | Sutrina ........................ | 257/698 |
| 5,424,579 A | * | 6/1995 | Arai et al. ................... | 257/690 |
| 5,945,730 A | * | 8/1999 | Sicard et al. ............... | 257/666 |

* cited by examiner

Primary Examiner—Jasmine J. Clark
(74) Attorney, Agent, or Firm—Morrison & Foerster LLP

(57) ABSTRACT

A semiconductor device includes a power supply semiconductor chip that has a plurality of current passing electrodes and a plurality of control electrodes. Conductive plates are disposed on the current electrodes and the control electrodes, and extend to regions for external connections. The conductive plates also includes connecting regions that are suspended between the chip and the external connection regions and suppers vibration propagating to the chip. One conductive plate unit for the current passing electrodes and another conductive plate unit for the control electrodes are separately soldered on the corresponding electrodes. Alternatively, only one unit may be soldered on the semiconductor chip, and portions of the unit may be removed to fabricate the device. Because of the absence of wire-bonding steps, the semiconductor chip does not receive impact of wire-bonding during the manufacturing process.

6 Claims, 9 Drawing Sheets

SEMICONDUCTOR DEVICE AND METHOD FOR MANUFACTURING SAME

BACKGROUND OF THE INVENTION

1. Field of the Invention

The invention relates to semiconductor device that includes a semiconductor chip for power supply, specifically to a wiring structure of the device for external connection.

2. Description of the Related Art

Conventional power supply semiconductor devices are described, for example, in Japanese Laid-Open Patent Publication No. Hei 5-206449. As described in the publication, conventional power supply semiconductor devices relies on switching chips of standard size. To meet a specific current capacity requirement for an application of the device, the standard-size switching chips are connected in parallel to fabricate the power supply semiconductor device.

Now, referring to FIG. 10 through FIG. 12, an example of the configuration of the conventional power supply semiconductor device is briefly explained below. The description on the operation circuit of this semiconductor device is found in the aforementioned publication. FIG. 10 is a plan view of the semiconductor device. FIG. 11 is a cross-sectional view along line A—A of FIG. 10. FIG. 12 is a cross-sectional view along line B—B of FIG. 10.

A second electrode plate 3 is formed around the edge portions of a rectangular first electrode plate 1 made of copper, and is disposed on the first electrode plate 1 through an insulating plate 2 made of an insulating material such as alumina. A third electrode plate 5 is formed at the center of the first electrode plate 1. The third electrode plate 5 is disposed through an insulating plate 4 made of a material such as alumina, and formed in the shape of a stripe which is aligned parallel with two of the sides of the second electrode plate 3 formed on the first electrode plate. Furthermore, a buffer plate 6 is formed on the first electrode plate 1 away from the second electrode plate 3 and the third electrode plate 5 to surround the third electrode plate 5. The buffer plate 6 is made of a metal, such as molybdenum, having a thermal expansion coefficient that is approximately equal to that of a semiconductor.

Furthermore, three rectangular IGBT (Insulated Gate Bipolar Transistor) chips 7 are fixed on the buffer plate 6 in each of the two rows, as shown in FIG. 10. Two rectangular diode chips 8 are fixed near the corners of the buffer plate 6. The IGBT chip 7 has a pair of principal surfaces, with a collector electrode 9 provided on one principal surface, and emitter electrodes 10 and a gate electrode 11 provided on the other principal surface. The collector electrode 9 is disposed so as to face the buffer plate 6. On the other hand, the diode chip 8 has a pair of principal surfaces, with an anode electrode 12 provided on one principal surface and a cathode electrode 13 provided on the other principal surface. The cathode electrode 13 is disposed so as to face the buffer plate 6.

The emitter electrodes 10 on the IGBT chips 7 are electrically connected to the second electrode plate 3 with bonding wires 14. The gate electrode 11 on the IGBT chip 7 is connected to the third electrode plate 5 with the bonding wires 14. The anode electrode 12 on the diode chips 8 is connected to the second electrode plate 3 with bonding wires 15. The semiconductor device further includes an adhesive layer 16 formed of a material such as solder, a first lead terminal 17, a second lead terminal 18, and a third lead terminal 19. These lead terminals may be integrated with the electrode plates, or they may be separately provided to combine with the corresponding electrode plates.

As described above, the conventional power supply semiconductor device is configured such that the emitter electrodes 10 on the IGBT chips 7 are connected to the second electrode plate 3 with bonding wires 14. Because many emitter electrodes 10 are formed on the IGBT chips 7, the bonding wire 14 must be connected to each of the emitter electrodes 10. Likewise, a multiple wire bonding must be performed for each of the anode electrodes 12. It should be note that the semiconductor device can provide various functions by changing the number of IGBT chips 7 and diode chips 8 that it uses.

In this configuration, to supply uniform current to the emitter region, the number of the bonding wires 14 must be the same as that of the emitter electrodes 10. Accordingly, boding must be repeated the number of times equal to the number of the bonding wires 14. For this reason, the wire bonding process needs a long process period, thus making this process inefficient.

Furthermore, to connect a plurality of emitter electrodes 10 on the IGBT chips 7 to the second electrode plate 3 with the bonding wires 14, wire bonding with heat and pressure or with ultrasonic wave must be performed. During such a bonding procedure, vibrations inevitably occur at the IGBT chips 7, thereby asserting mechanical stresses on the chips 7. As a result, repeating the bonding procedure multiple times on the same chip induces crack formation in interlayer insulating films made of a material such as silicon oxide.

SUMMARY OF THE INVENTION

The invention provides a semiconductor device including a semiconductor chip having a plurality of current passing electrodes and a plurality of control electrodes. Each of the current passing electrodes and the control electrodes is disposed on a primary surface of the semiconductor chip. The device also includes a first electrically conductive region and a second electrically conductive region each for external electrical connection, and a first electrically conductive plate provided for each of the current passing electrodes and having a first contact portion soldered on each of the current passing electrodes. One end of the first electrically conductive plate is connected to the first electrically conductive region. The device further includes a second electrically conductive plate provided for each of the control electrodes and having a second contact portion soldered on each of the control electrodes. One end of the second electrically conductive plate is connected to the second electrically conductive region.

The invention also a method of manufacturing a semiconductor device. The method includes providing a semiconductor chip having a plurality of current passing electrodes and a plurality of control electrodes. The current passing electrodes and the control electrodes are disposed on a primary surface of the semiconductor chip. The method also includes providing a first electrically conductive unit having a first support portion, a plurality of first connecting portions each extending from the first support portion, and a plurality of first contact portions each extending from the corresponding first connecting portions, and providing a second electrically conductive unit having a second support portion, a plurality of second connecting portions each extending from the second support portion, and a plurality of second contact portions each extending from the corresponding second connecting portions. The method further includes soldering the first contact portions on the corresponding current passing electrodes, and soldering the second contact portions on the corresponding control electrodes.

The invention further provides a method of manufacturing a semiconductor device. The method includes providing a semiconductor chip having a plurality of current passing electrodes and a plurality of control electrodes. The current passing electrodes and the control electrodes are disposed on a primary surface of the semiconductor chip. The method also includes providing a electrically conductive unit having a first support portion, a second support portion, a plurality of first connecting portions each extending from the first support portion, a plurality of second connecting portions each extending from the second support portion, and a plurality of contact portions connecting the first and second connecting portions. The method further includes soldering the contact portions on the corresponding current passing and control electrodes, and removing one of the first and second connecting portions for each of the contact portions.

DETAILED DESCRIPTION OF THE INVENTION

Now, the invention will be described in detail with reference to FIG. 1 through FIG. 9.

Figure 1:
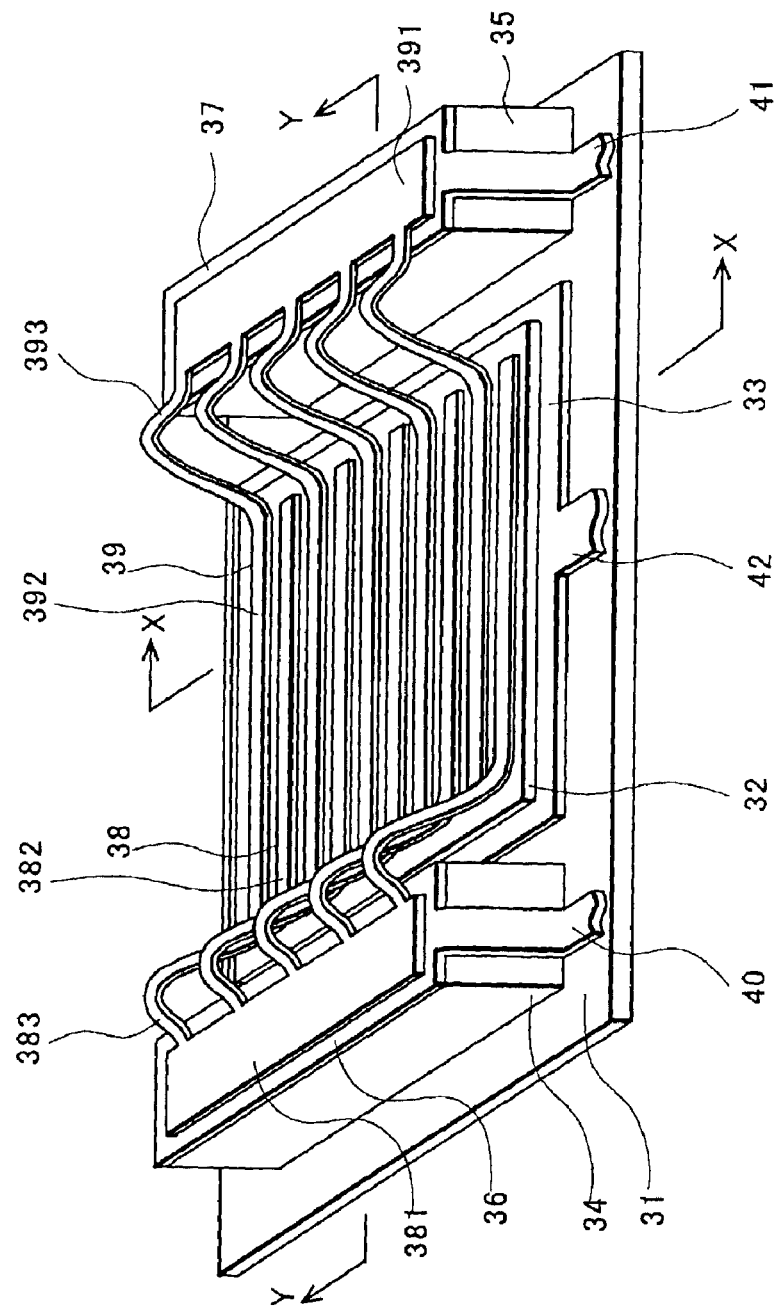
FIG. 1 is a perspective view of a semiconductor device according to an embodiment of the invention.
Figure 2:
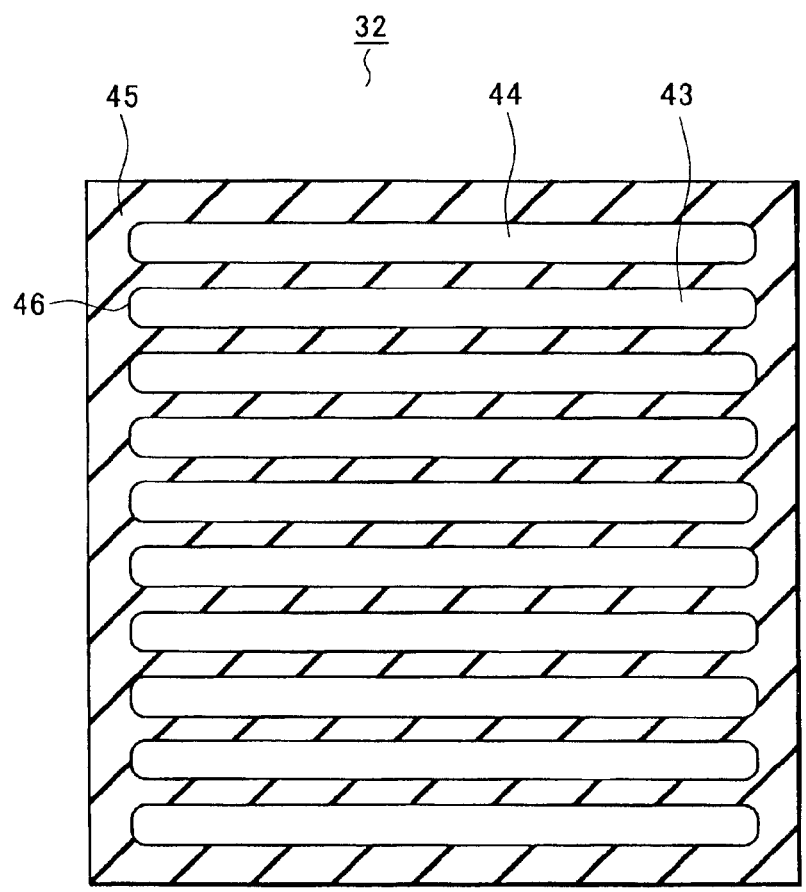
FIG. 2 is a plan view of a semiconductor chip for use with the semiconductor device of the embodiment.
Figure 3:
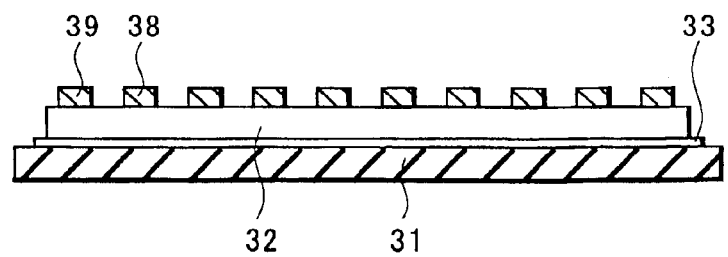
FIG. 3 is a cross-sectional view of the semiconductor device of FIG. 1 along line X—X of FIG. 1.
Figure 4:
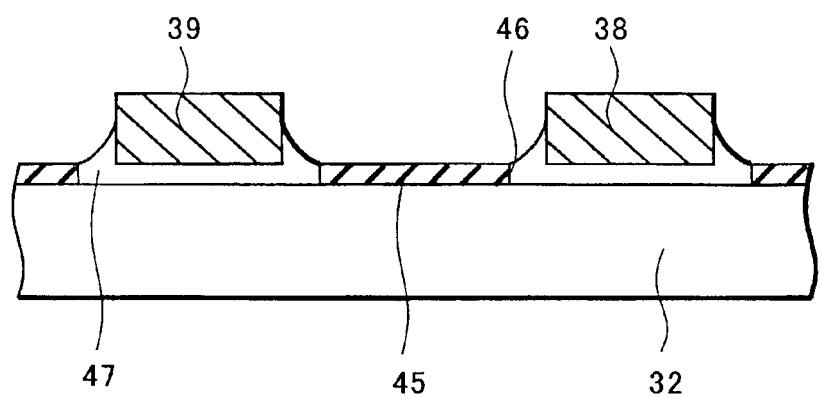
FIG. 4 is a partial expanded view of the cross-sectional view of FIG. 3.
Figure 5:
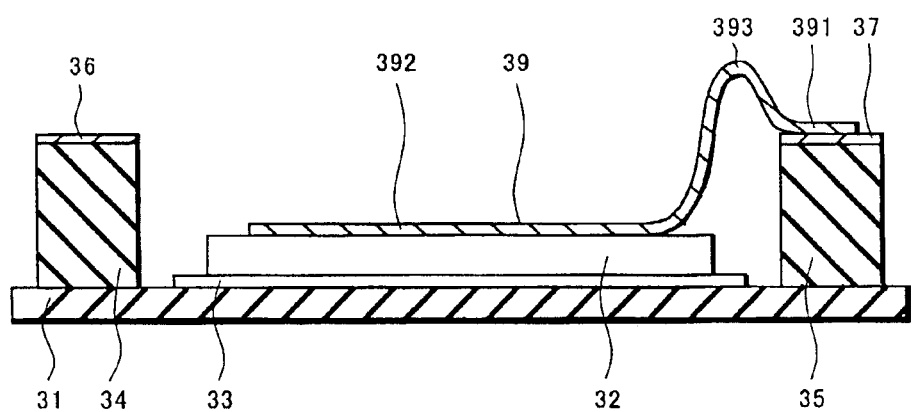
FIG. 5 is a cross-sectional view of the semiconductor device of FIG. 1 along line Y—Y of FIG. 1.

An embodiment of the invention employs an IGBT chip which has two different types of electrodes alternately formed on a principal surface of the chip. This embodiment also applies to a GTBT (Grounded-Trench-MOS assisted Bipolar-mode FET) chip. FIG. 1 shows a structures of the semiconductor device of this embodiment. FIG. 2 is a plan view illustrating a surface of the semiconductor chip of the semiconductor device shown in FIG. 1. FIG. 3 is a cross-sectional view along line X—X shown in FIG. 1. FIG. 4 is a cross-sectional view illustrating an electrically conductive plate fixed on an electrode. FIG. 5 is a cross-sectional view along line Y—Y shown in FIG. 1. FIGS. 6–9 show the assembly steps of the semiconductor device of FIG. 1.

As shown in FIG. 1, the semiconductor device of this embodiment mainly includes an insulating substrate 31, a securing region 33 that is made of an electrically conductive foil to contact a collector electrode and is provided on the insulating substrate 31 to secure the IGBT chip 32, a pair of seats 34, 35 that is made of an insulating material and is formed on both sides of the securing region 33, connection regions 36, 37 that are made of an electrically conductive foil and are formed on the seats 34, 35 for external connection, electrically conductive plates 38 fixed on emitter electrodes 43 of the semiconductor chip and electrically conductive plates 39 fixed on gate electrodes 44 of the semiconductor chip, and an emitter terminal 40 and a gate terminal 41 each for connecting this device to an external device. The emitter electrode and the collector electrode serve as current passing electrodes, and the gate electrode serves as a control electrode because the electric current between the emitter and collector electrodes is controlled by the signal received by the gate electrode.

Now, each component that makes up the semiconductor device of this embodiment is described below.

First, the substrate 31 is described. In this embodiment, the power supply semiconductor chip 32, which is the IGBT chip, of a current density of 300 A/cm$^2$ is mounted on the substrate 31. Because of the large heat generation by the semiconductor chip 32, a ceramic substrate is employed which has a good heat dissipation capability. Other materials that may be used as the substrate 31 include metal substrates with insulated top surface, such as a Cu substrate, an Fe substrate, and an alloy such as an Fe—Ni substrate, and an AlN (aluminum nitride) substrate. It is also possible to attach a ceramic substrate on the metal substrate.

The seats 34, 35 placed on the substrate 31 require machinability, heat dissipation, and thus is formed of a ceramic. The seats 34, 35 are disposed on both sides of the semiconductor chip 32 opposite to each other, with the surface of the seats 34, 35 being located higher than that of the semiconductor chip 32. In this embodiment, the connection region 36 is a copper foil that is formed on the seat 34 and extends to the emitter terminal 40. Thus, the emitter electrode 43 is connected to an external device through the conductive plate 38, the connection region 36 and the emitter terminal 40. Similarly, the connection region 37 is formed on the seat 35 for the external connection of the gate electrode 44.

Additionally, the emitter terminal 40 is formed as one unit combined with the connection region 36. Likewise, the gate terminal 41 is formed as one unit combined with the connection region 37. The seats 34, 35 may be eliminated when the connection regions 36, 37 are formed directly on the insulating substrate 31. Furthermore, the semiconductor chip 32 does not have to be mounted on the insulating substrate 31, but may be mounted on a lead frame, a printed circuit board or the like to implement the wiring structure of this embodiment.

The structure of the primary surface of the semiconductor chip 32 prior to receiving the conductive plates is described below with reference to FIG. 2. There is formed an insulating layer 45 on the surface of the semiconductor chip 32, and the emitter electrodes 43 and gate electrodes 44 are exposed through holes 46 provided in the insulating layer 45. Here, the holes 46 provided in the insulating layer 45 each have an opening that extends horizontally on the surface of the semiconductor chip to form parallel lines. The holes 46 are substantially parallel in the thickness direction of the insulating layer as well. The emitter electrodes 43 and the gate electrodes 44 are exposed alternately from the corresponding holes 46. A silicon oxide film (not shown) is formed as an interlayer insulating film below the emitter electrode 43 and the gate electrode 44.

As shown in FIG. 3, the semiconductor device of this embodiment includes the feature that electrically conductive plates 38, 39, made of Cu or a Cu alloy are fixed with solder 49 (see FIG. 4) on the emitter electrodes 43 and the gate electrodes 44 exposed from the insulating layer 45 on the primary surface of the semiconductor chip 32. Each of the emitter electrodes 43 and the gate electrodes 44 receives one conductive plate.

Specifically, as shown in FIG. 1, the electrically conductive plate 38 in contact with the emitter electrode 43 includes a support portion 381, a contact portion 382 and a connecting portion 383. Similarly, the electrically conductive plate 39 in contact with the gate electrode 44 includes a support portion 381, a contact portion 382 and a connecting portion 383.

First, the support portions 381, 391, the contact portions 382, 392 and the connecting portions 383, 393 are each combined as one unit, and the support portions 381, 391 are attached on the connection regions 36, 37 to support the entire conductive plates 38, 39. This allows the support portions 381, 391 to collectively supply electric currents to the emitter electrodes 43 or to the gate electrodes 44 on the surface of the semiconductor chip 32, respectively.

The contact portions 382, 392 are disposed at equal intervals in an interdigitated shape and extend from the support portions 381, 391 to cover the corresponding emitter electrodes 43 and the gate electrodes 44 on the surface of the semiconductor chip 32. The contact portions 382, 392 are fixed on the corresponding emitter electrodes 43 and gate electrodes 44 using a solder. The contact portions 382, 392 have a contact area substantially large enough to cover the entire individual emitter electrodes 43 and the gate electrodes 44 exposed from the holes 48. The insulating layer 45 is made of a material having no wettability to solder. Thus, the surface tension of the solder which is used to fix the contact portions 382, 392 on the electrodes 43, 44 aligns the contact portions 382, 392 with the corresponding electrodes 43, 44 within the corresponding holes 46 without any application of external force. Accordingly, in this embodiment, on the surface of the semiconductor chip 32, the electrically conductive plates 38, 39 are disposed in ten lines that are substantially parallel to each other with an equal interval. Consequently, any two conductive plates next to each other are positioned parallel because of the self-alignment due to the surface tension of the solder. This leads to prevention of short circuits by eliminating probable contacts between the conductive plates. Furthermore, the soldering procedure of the conductive plates on the electrodes is effective and easy because of the self-alignment. It is also possible to change the width and the thickness of the electrically conductive plates 38, 39 depending on the semiconductor chip 32 to be used or the current capacity required in an application.

The connecting portions 383, 393 are suspended and bent upward between the semiconductor chip 32 and the connection regions 36, 37. This embodiment is characterized in that the connecting portions 383, 393 are curved. In this structure of the semiconductor device of this embodiment, when vibrations are generated around the seats 34, 35, the connecting portions 383, 393 of the electrically conductive plates 38, 39 absorb the vibrations and prevent them from reaching the surface of the semiconductor chip 32.

In this configuration, the connecting portions 383, 393 have the same width as the contact portions 382, 392. This makes it possible to dump vibrations of smaller amplitudes, thus significantly reducing vibrations propagating to the surface of the semiconductor chip 32. Additionally, the width of the connecting portions 383, 393 can be made smaller than that of the contact portions 382, 392, thereby increasing the aforementioned effects.

The structure of the semiconductor device of this embodiment requires no wire bonding carried out on the surface of the semiconductor chip 32. Accordingly, vibrations on the surface of the semiconductor chip can be minimized, and prevent adverse effects such as crack formation in the interlayer insulating film formed at the lower regions of the electrodes 43 and 44 of the semiconductor chip 32.

Furthermore, the presence of the connecting portions 383, 393 provides tolerance for some errors in the size and positioning of the connection regions 36, 37 and the semiconductor chip 32 because the suspended connecting portions 383, 393 are flexible enough to accommodate minor positioning deviations. As a result, for example, this structure allows the seats 34, 35 to have a large height tolerance, thereby providing improved workability and mass-productivity in the manufacturing of the semiconductor device.

In this embodiment, the connecting portions 383, 393 have a smooth curved shape. However, they can be of any shape, for example a rectangular shape, so long as the shape assures the aforementioned effects.

Finally, the securing region 33 made of a copper foil is formed on the substrate 31. As described above, on the back side of the semiconductor chip 32, formed is a collector electrode (not shown), which is electrically connected to the securing region 33 using a solder. A collector terminal 42 is formed as one unit combined with the securing region 33. The securing region 33 is thus connected to an external lead through the collector terminal 42.

Now, two methods of manufacturing the semiconductor device of this embodiment is described with reference to FIG. 6 through FIG. 9. The same reference numerals as in the FIGS. 1–5 are used to indicate the same corresponding components in FIGS. 6–9.

Figure 6:
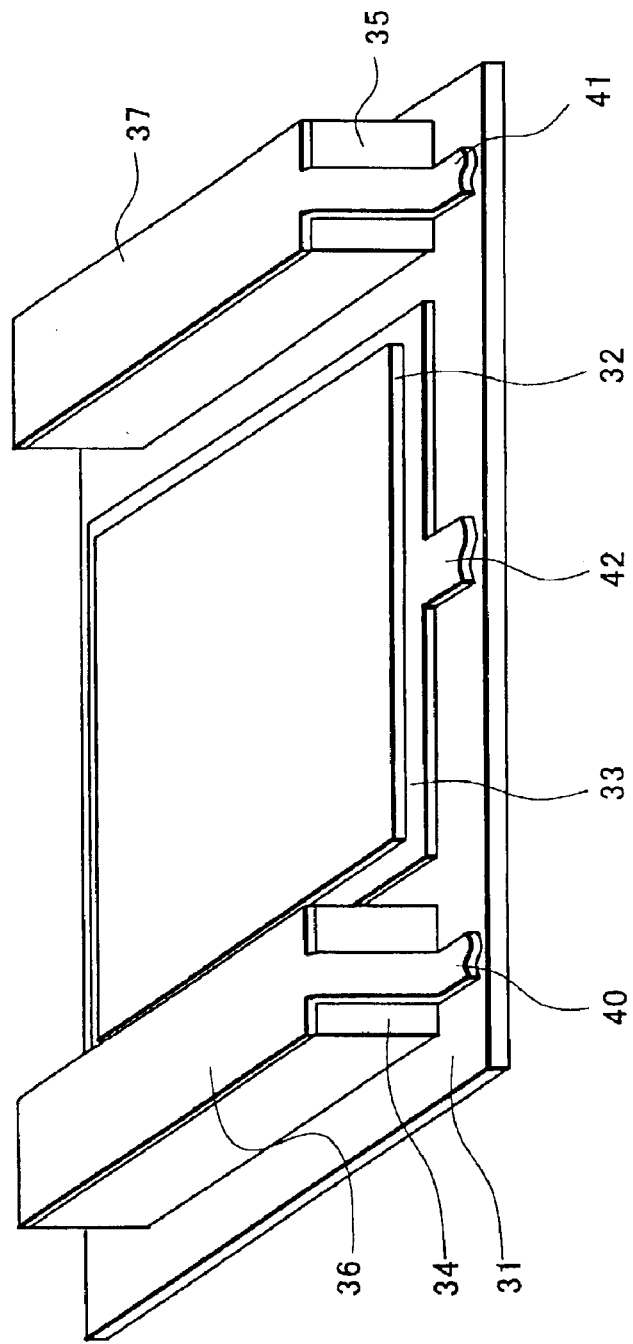
FIG. 6 is a perspective view of the semiconductor chip mounted on a base structure of the embodiment.

In the first method, as shown in FIG. 6, the first step to fabricate the device is to provide a base structure and mount the semiconductor chip 32 on the base structure.

In this step, first, the substrate 31 is provided. The power supply semiconductor chip 32, such as an IGBT chip, having a current density of about 300 A/cm$^2$ is mounted on the substrate 31. Other materials that may be used as the substrate 31 include metal substrates with insulated top surface, such as a Cu substrate, an Fe substrate, and an alloy such as an Fe—Ni substrate, and an AlN (aluminum nitride) substrate. It is also possible to attach a ceramic substrate on the metal substrate.

Then, an electrically conductive foil is pressed onto the central portion of the substrate 31 to form the securing region 33. The size of the securing region 33 depends on the size of the semiconductor chip 33 that it carries thereon. The collector terminal 42 is also formed at this step as an extension of the securing region 33.

The materials for the conductive foil are selected based on adhesion to the solder, which is used to mount the semiconductor chip 33 later in the manufacturing process, and ease of wire bonding. In this embodiment, a Cu-based foil is used. Other appropriate materials are a Al-based foil, a Fe—Ni alloy and the like.

Subsequently, a pair of seats 34, 35 is placed on both sides of the securing region 33 on the substrate 31. The seats 34, 35 are formed of a ceramic in consideration of their machinability, heat dissipation and the like. A copper foil is also attached on the top surface of each of the seats 34, 35 to form the connection regions 36, 37. The emitter terminal 40 and the gate terminal 41 are formed at the same process step as the terminal as their extensions. The device structure of this embodiment may include those without the seats 34, 35, as described above. The manufacturing process of such a device does not include the formation of the seats.

Figure 7A:
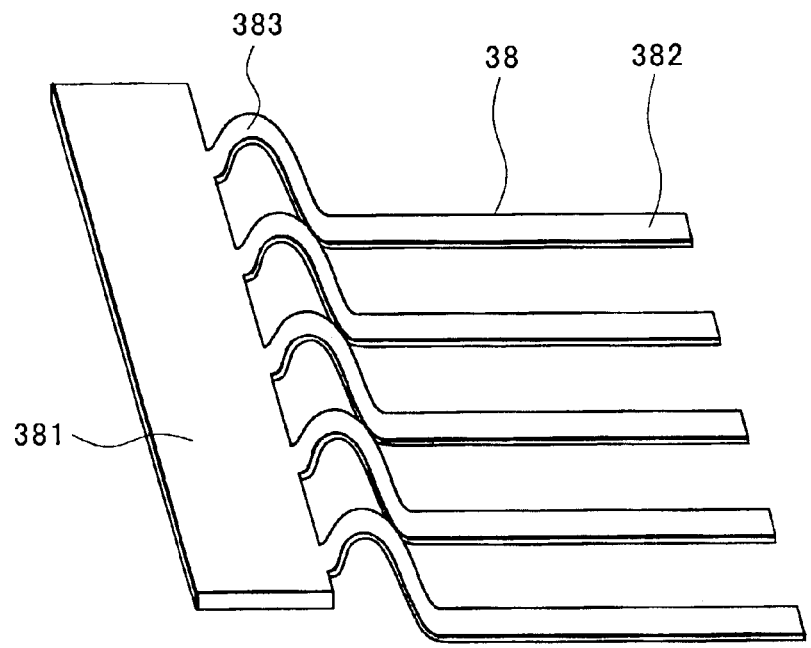
FIGS. 7A and 7B are perspective views of two sets of conductive plates of the semiconductor device of FIG. 1 prior to mounting on the base structure of FIG. 6.
Figure 7B:
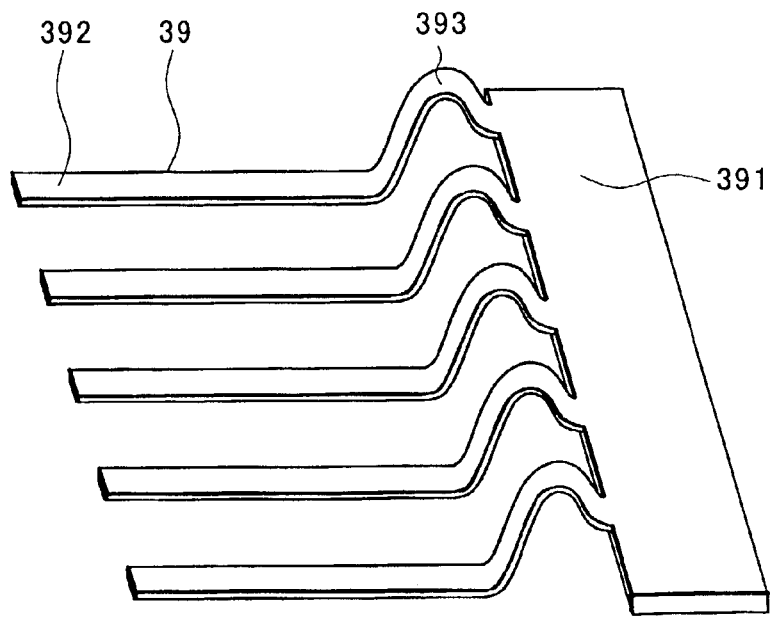

In the next step, as shown in FIG. 7A and FIG. 7B, first, electrically conductive metal platse are prepared from a metal plate which is larger than the surface of the semiconductor chip. For example, this metal plate is made of copper and of about 50 $\mu$m to 100 $\mu$m in thickness. However, the thickness is determined in accordance with applications of the device. There are two methods for forming the electrically conductive plates 38, 39, i.e., a method employing etching and pressing, and a method employing punching and pressing.

The method that employs etching and pressing is described first. A photoresist (an etching resistant mask) is formed on the metal plate. Then, the photoresist is patterned so as to expose the metal plate excluding the regions that correspond to the support portions 381, 391, the contact portions 382, 392, and the connecting portions 383, 393. Then, the metal plate is selectively etched through the photoresist. As the etchant, ferric chloride or cupric chloride is frequently employed. The contact regions of the support portions 381, 391 and the contact portions 382, 392 may be selectively plated in advance, thereby making it possible to provide improved solder wettability in the subsequent mounting process.

Then, the etched metal plate that includes support portions 381, 391, the contact portions 382, 392, and the connecting portions 383, 393 is pressed to bend the connecting portions 383, 393. The connecting portions 383, 393 are positioned closer to the support portions 381, 391 than the contact portions 382, 392. Accordingly, the connecting portions 383, 393 are suspended between the semiconductor chip 32 and the connection regions 36, 37 when they are mounted on the base structure. Additionally, the connecting portions 383, 393 must remain flat to be in contact with the emitter electrodes 43 and the gate electrodes 44 exposed on the surface of the semiconductor chip 32.

Now, described below is the method for forming the electrically conductive plates 38, 39 by employing punching and pressing. First, a rolled metal plate is prepared which is about 50 $\mu$m to 100 $\mu$m in thickness and has a width equal to or larger than that of the semiconductor chip 32. After placing the metal plate on a die that has through-holes in the regions other than those corresponding to the support portions 381, 391, the contact portions 382, 392, and the connecting portions 383, 393, the metal plate is punched through to form the electrically conductive plates 38, 39. Then, the connecting portions 383, 393 are placed on another die that has a curved top corresponding to the shape of the connecting portions 383, 393 shown in FIG. 1, and pressed onto the die to form the electrically conductive plates 38, 39 as shown in FIGS. 7A and 7B.

Subsequently, the electrically conductive plates 38, 39 thus formed are fixed on the surface of the semiconductor chip 32 so that the contact portions 382, 392 cover the emitter electrodes 43 and the gate electrodes 44. At this step, the contact areas of the contact portions 382, 392 are plated with a solder in advance and then fixed on the surface of the semiconductor chip 32. Conversely, the emitter electrodes 43 and the gate electrodes 44 may be plated in advance. The self-alignment due to the surface tension of the solder places the conductive plates 38, 39 accurately into the holes of the insulating layer on the surface of the semiconductor chip 32. As a result, the contact portions 382, 392 of the conductive plates 38, 39 are fixed on the emitter electrodes 45 and the gate electrodes 46 with good positional accuracy.

Then, as shown in FIG. 1, the support portions 381, 391 are also fixed on the connection regions 36, 37, using a solder. At the end of this step, the semiconductor device shown in FIG. 1 is completed. In this embodiment, the connecting portions 383, 393 are formed individually corresponding to each of the electrodes. However, two or more of the connecting portions may be combined to support a plurality of connecting portions.

Although the individual electrically conductive plates 38, 39 are minute in size, they are handled as one large unit 38, 39 during the fixation on the semiconductor chip 32. In addition to the accurate and easy initial positioning of the large units on the semiconductor chip surface, the self-alignment further improves the accuracy of the positioning. As a result, it is possible to improve the workability of this processing step and mass productivity of the semiconductor device.

Now, the second method for manufacturing a semiconductor device of this embodiment of the present invention is described below. Here, the difference between the first and second methods is first described. That is, in the first method, two sets of the electrically conductive plate 38 are prepared separately, and then fixed on the surface of the semiconductor chip 32 individually. On the other hand, in the second method, only one set of the conductive plates is prepared which correspond to both the emitter electrodes 43 and the gate electrodes 44. Then, after this unit is fixed on the surface of the semiconductor chip 32, unnecessary portions (one of the connecting portions for each conductive plate) are removed to electrically separate the conductive plates 38 for the emitter electrodes from the conductive plates 39 for the gate electrodes.

In the second method, the first step to fabricate the device is to provide a base structure and mount the semiconductor chip 32 on the base structure, as shown in FIG. 6. This first step is the same as the first step of the first method.

Figure 8:
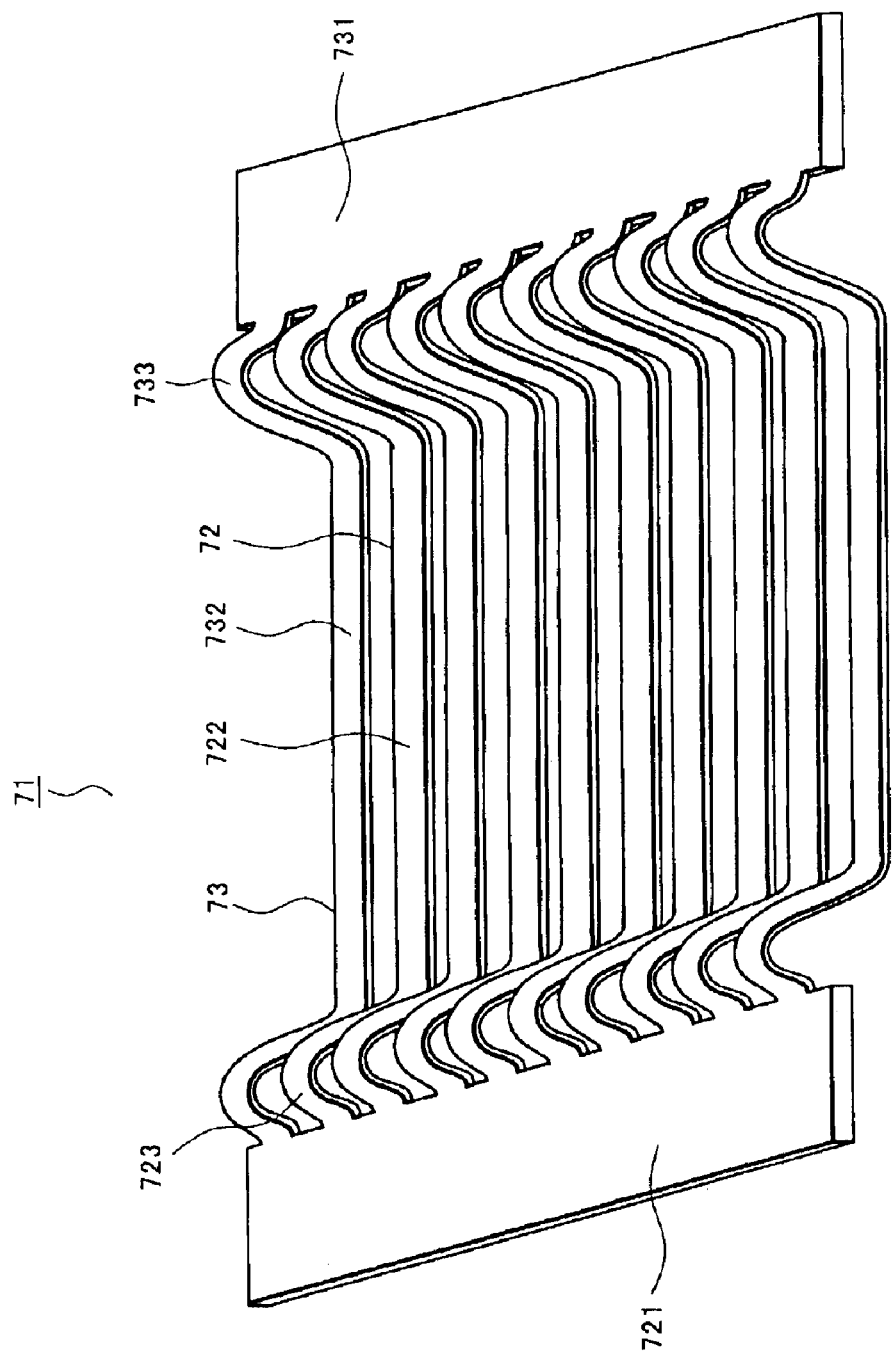
FIG. 8 is a perspective view of another set of conductive plates of the semiconductor device of FIG. 1 prior to mounting on the base structure of FIG. 6.

Next step is to prepare the unit of conductive plates 71 shown in FIG. 8 that includes the conductive plates 38 for the emitter electrodes and the conductive plates 39 for the gate electrodes. This unit is made from a flat metal plate that is similar to that of the first method including the size and thickness. The contact portions 722 for the emitter electrodes and the contact portions 732 for the gate electrodes are supported by the two supporting portions 721, 731 through the connecting portions 723, 733. The two forming methods described in the first manufacturing method may be applied to the formation of the unit 7. Accordingly, a flat ladder-like structure is first formed by etching or punching, and then the ladder is pressed to form the connecting portions 723, 733.

Figure 9:
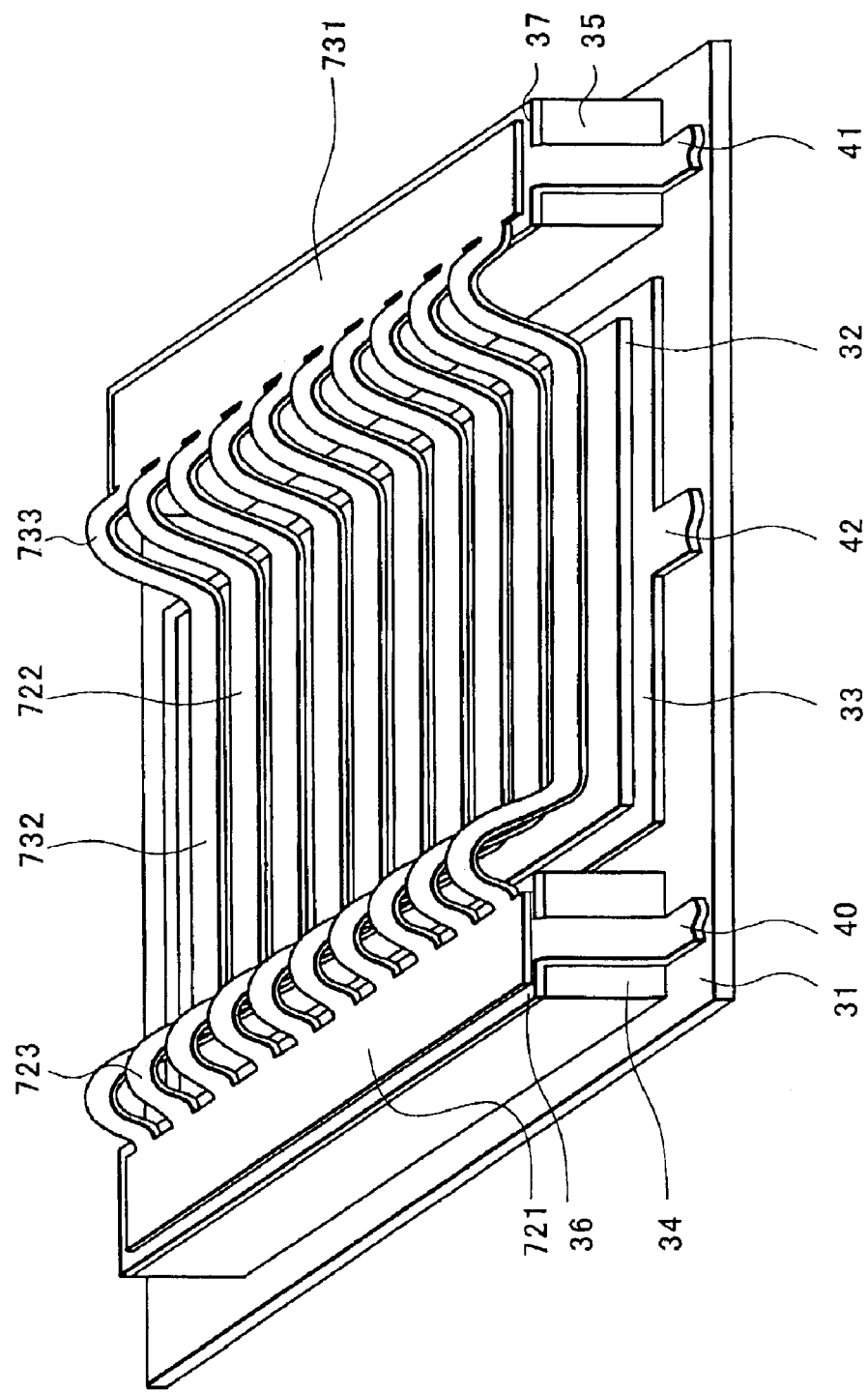
FIG. 9 is a perspective view of the set of the conductive plates of FIG. 8 mounted on the base structure of FIG. 6.
Figure 10:
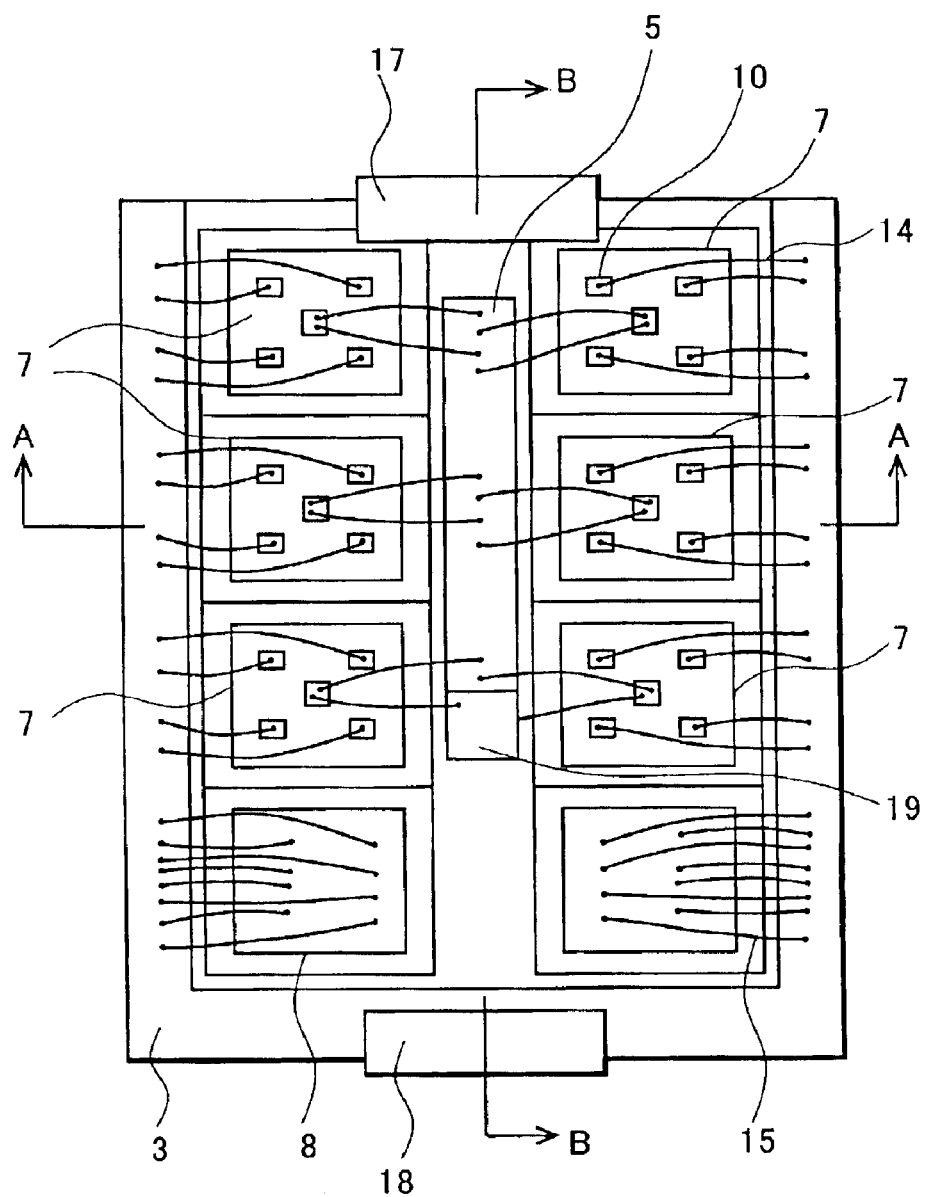
FIG. 10 is a plan view of a conventional semiconductor device.
Figure 11:
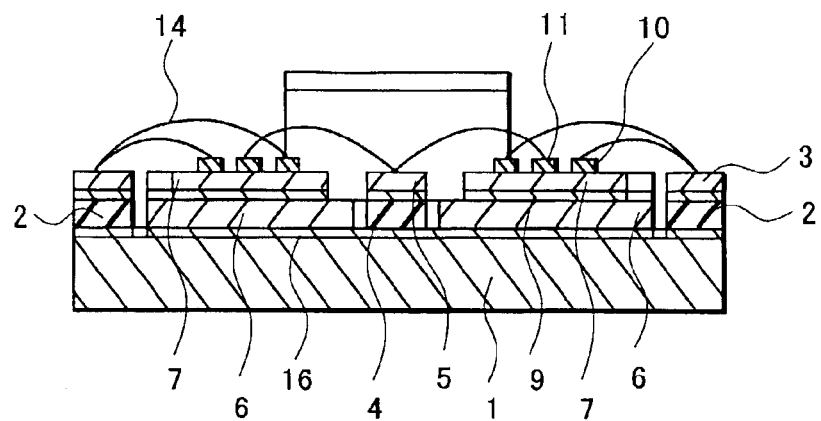
FIG. 11 is a cross-sectional view of the conventional semiconductor device of FIG. 10.
Figure 12:
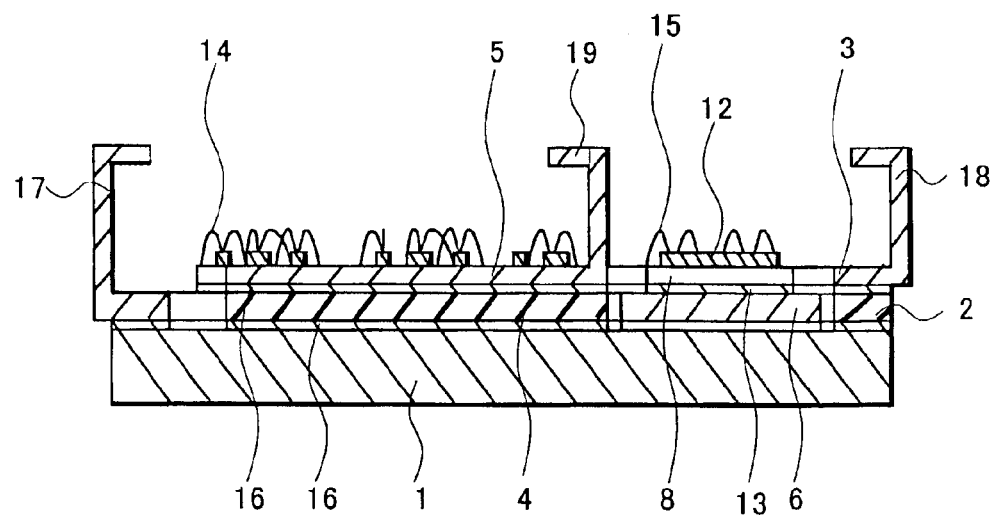
FIG. 12 is another cross-sectional view of the conventional semiconductor device of FIG. 10.

Subsequently, the unit 71 is mounted on the base as shown in FIG. 9. The step of fixing the unit 71 on the semiconductor chip surface as well as the seats 34, 35 are the same as in the first method. In short, the contact portions 722, 732 are fixed on the corresponding emitter electrodes 43 and gate electrode 44 using a solder, and the support portions 721, 731 are fixed on the connection regions 36, 37 using the solder. The portions for soldering may be plated prior to the soldering procedure.

Then, one of the connecting portions 723, 733 for each conductive plate is removed so that each contact region is connected to only one support portion. In this manner, the conductive plates 38 for the emitter electrodes 43 are electrically separated from the conductive plates 39 for the gate electrodes 44. At the end of this step, a semiconductor device shown in FIG. 1 is completed The above is a detailed description of particular embodiment of the invention which is not intended to limit the invention to the embodiment described. It is recognized that modifications within the scope of the invention will occur to persons skilled in the art. Such modifications and equivalents of the invention are included within the scope of this invention.

What is claimed is:

1. A semiconductor device comprising:
   a semiconductor chip comprising a plurality of current passing electrodes and a plurality of control electrodes, each of the current passing electrodes and the control electrodes being disposed on a primary surface of the semiconductor chip;
   a first electrically conductive region and a second electrically conductive region each for external electrical connection;
   a first electrically conductive plate provided for each of the current passing electrodes and comprising a first contact portion soldered on said each of the current passing electrodes, one end of the first electrically conductive plate being connected to the first electrically conductive region; and
   a second electrically conductive plate provided for each of the control electrodes and comprising a second contact portion soldered on said each of the control electrodes, one end of the second electrically conductive plate being connected to the second electrically conductive region.

2. The semiconductor device of claim 1, wherein the first electrically conductive plate further comprises a first connecting portion that is suspended between the semiconductor chip and the first electrically conductive region, and the second electrically conductive plate further comprises a second connecting portion that is suspended between the semiconductor chip and the second electrically conductive region.

3. The semiconductor device of claim 1, wherein the first electrically conductive plate further comprises a first support portion that is soldered on the first electrically conductive region, and the second electrically conductive plate further comprises a second support portion that is soldered on the second electrically conductive region, and
   wherein the first support portions for the first electrically conductive plates form one support plate supporting the first electrically conductive plates, and the second support portions for the second electrically conductive plates form one support plate supporting the second electrically conductive plates.

4. The semiconductor device of claims 2 or 3, wherein the first and second connecting portions are bent away from the semiconductor chip.

5. The semiconductor device of claim 4, wherein the first electrically conductive plates and the second electrically conductive plates are interposed among each other.

6. The semiconductor device of claim 1, wherein the first and second electrically conductive plates are made of copper.

* * * * *